(12) United States Patent
Suzuki et al.

(10) Patent No.: US 7,700,959 B2
(45) Date of Patent: Apr. 20, 2010

(54) SEMICONDUCTOR LIGHT-EMITTING DEVICE, SEMICONDUCTOR LIGHT-EMITTING APPARATUS, AND METHOD OF MANUFACTURING SEMICONDUCTOR LIGHT-EMITTING DEVICE

(75) Inventors: Jun Suzuki, Kanagawa (JP); Masato Doi, Kanagawa (JP); Hiroyuki Okuyama, Kanagawa (JP); Goshi Biwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 293 days.

(21) Appl. No.: 11/568,427

(22) PCT Filed: Mar. 31, 2005

(86) PCT No.: PCT/JP2005/006814

§ 371 (c)(1),
(2), (4) Date: Sep. 7, 2007

(87) PCT Pub. No.: WO2005/106974

PCT Pub. Date: Nov. 10, 2005

(65) Prior Publication Data

US 2008/0121904 A1      May 29, 2008

(30) Foreign Application Priority Data

Apr. 27, 2004   (JP) ............................. 2004-132007

(51) Int. Cl.
*H01L 29/18*   (2006.01)
*H01L 33/00*   (2006.01)
*H01L 29/15*   (2006.01)
*H01L 29/22*   (2006.01)
*H01L 31/0256*   (2006.01)
*H01L 31/0296*   (2006.01)
*H01L 29/201*   (2006.01)
*H01L 29/205*   (2006.01)
*H01L 29/227*   (2006.01)

(52) U.S. Cl. ............................. 257/88; 257/78; 257/90; 257/91; 257/98; 257/E33.025; 257/E33.03; 257/E33.064

(58) Field of Classification Search .................. 257/13, 257/78, 98, E33.001, E33.025, E33.03, 88, 257/90–91, E33.064
See application file for complete search history.

(56) References Cited

U.S. PATENT DOCUMENTS 5,668,382 A * 9/1997 Toda et al. .................... 257/77

(Continued)

FOREIGN PATENT DOCUMENTS

JP           10-12921          1/1998

(Continued)

*Primary Examiner*—Ida M Soward
(74) *Attorney, Agent, or Firm*—K&L Gates LLP

(57) ABSTRACT

A semiconductor light-emitting device capable of obtaining a high light reflectance through the use of a high-reflection metal layer formed on the side of an electrode on one side and capable of preventing migration of atoms from the high-reflectance metal layer is provided. Semiconductor layers of the opposite conduction types are formed on the opposite sides of an active layer, and an ohmic contact layer being a thin film for contriving a decrease in contact resistance, a transparent and conductive layer, and a high-reflection metal layer for reflecting light generated in the active layer are sequentially layered on one of the semiconductor layers. Since the transparent conductive layer functions also as a barrier layer and it transmits light, a high light take-out efficiency can be obtained through the reflection at the high-reflectance metal layer.

5 Claims, 3 Drawing Sheets

U.S. PATENT DOCUMENTS

| | | | |
|---|---|---|---|
| 6,657,300 B2 * | 12/2003 | Goetz et al. | 257/745 |
| 6,740,906 B2 * | 5/2004 | Slater et al. | 257/99 |
| 6,806,112 B1 * | 10/2004 | Horng et al. | 438/29 |
| 6,825,502 B2 * | 11/2004 | Okazaki et al. | 257/98 |
| 6,963,086 B2 * | 11/2005 | Oohata | 257/99 |
| 6,998,281 B2 * | 2/2006 | Taskar et al. | 438/29 |
| 7,232,739 B2 * | 6/2007 | Kerdiles et al. | 438/458 |
| 7,323,723 B2 * | 1/2008 | Ohtsuka et al. | 257/98 |
| 2003/0015794 A1 * | 1/2003 | Chang et al. | 257/744 |
| 2003/0127644 A1 * | 7/2003 | Chen | 257/44 |
| 2004/0253368 A1 * | 12/2004 | Tokuda | 427/64 |
| 2004/0263068 A1 * | 12/2004 | Lee | 313/506 |
| 2005/0236636 A1 * | 10/2005 | Hon et al. | 257/96 |
| 2006/0072047 A1 * | 4/2006 | Sekiguchi | 349/25 |
| 2007/0187610 A1 * | 8/2007 | Morii et al. | 250/370.09 |
| 2008/0251808 A1 * | 10/2008 | Kususe et al. | 257/98 |

FOREIGN PATENT DOCUMENTS

| | | |
|---|---|---|
| JP | 11-191641 | 7/1999 |
| JP | 3068914 | 3/2000 |
| JP | 2002-164928 | 6/2000 |
| JP | 2000-194285 | 7/2000 |
| JP | 2001-217461 | 8/2001 |
| JP | 2001-351787 | 12/2001 |
| JP | 2002-26392 | 1/2002 |
| JP | 2003-347586 | 12/2003 |
| JP | 2004-119996 | 4/2004 |
| JP | 2004-311973 | 11/2004 |
| JP | 2005-39197 | 2/2005 |

* cited by examiner

SEMICONDUCTOR LIGHT-EMITTING DEVICE, SEMICONDUCTOR LIGHT-EMITTING APPARATUS, AND METHOD OF MANUFACTURING SEMICONDUCTOR LIGHT-EMITTING DEVICE

CROSS REFERENCE TO RELATED APPLICATIONS

The present application claims priority to Japanese Patent Document No. 2004-132007 filed on Apr. 27, 2004, the disclosure of which is herein incorporated by reference.

BACKGROUND

The present invention relates to a semiconductor light-emitting device in which light is emitted from an active layer formed between a pair of semiconductor layers, a semiconductor light-emitting apparatus using the semiconductor light-emitting device, and a method of manufacturing the semiconductor light-emitting device. In particular, the invention relates to a semiconductor light-emitting device enhanced in light extraction efficiency, a semiconductor light-emitting apparatus using the semiconductor light-emitting device, and a method of manufacturing the semiconductor light-emitting device.

In the light emitting diode, which is an example of semiconductor light-emitting devices, devices with a structure in which a nitride-based compound semiconductor material represented by a GaN-based semiconductor layer is used have been widely researched and developed. In the light-emitting devices using such a nitride-based compound semiconductor layer, a laminate structure having a p-type layer and an n-type layer with an active layer therebetween is adopted, and it may be necessary that a p-side electrode and an n-side electrode are put in ohmic contact with each of the p-type layer and the n-type layer so as to supply a current injected into the active layer. In this case, for realizing a light-emitting device with a high performance such as a high luminance, it may be indispensable to put the p-side electrode and the n-side electrode into ohmic contact with low resistance.

Meanwhile, the light taken out by injecting a current into the active layer is radiated not only to the face side of the device but also to the back side and the lateral sides of the device. In view of this, there has been known a technology in which a high-reflection film, for example, is formed on the back side of the light-emitting device where the light radiated from the device is unnecessary, whereby the light is reflected on the surface of the high-reflection film, and the light take-out efficiency on the face side or the like can be enhanced accordingly.

Such a high-reflection film is formed of such material as silver and aluminum. For instance, in the case where the ohmic contact is contrived on the side of the p-side electrode as above-mentioned and the like cases, a thin film of a metal capable of realizing the ohmic contact such as Ni, Pt, Mg, Zn, Be, Ag, Au and Ge is formed, before forming the high-reflection film of silver, aluminum or the like.

The metallic material constituting the high-reflection film is excellent in the light-reflecting characteristics, but, in the case of using such a metallic material as an electrode to be used by passing a current therethrough, migration as a diffusion phenomenon arising from heat or the like would be generated, whereby the function as the light-emitting device would be lost in a comparatively short time. Therefore, in the case of enhancing the light take-out efficiency by utilizing a high-reflection film, there is simultaneously a need for a means of restraining the generation of migration.

For enhancing the light take-out efficiency by utilizing such a high-reflection film so as to take out light on the substrate side through light reflection by the high-reflection film and for simultaneously preventing the generation of migration, there has been known a technology in which a barrier film is formed between a film for contriving ohmic contact and the high-reflection metal film. For example, as disclosed in Japanese Patent Laid-out No. 2002-26392, there has been known a technology in which an active layer and a p-type GaN layer are formed on an n-type GaN layer on a substrate, and a thin Ni film, a thin Mo film, and a metal film as a high-reflection film are formed to constitute a p-side electrode structure.

In the device structure described in Japanese Patent Laid-open No. 2002-26392, ohmic contact owing to the Ni film is realized and, simultaneously, a barrier function of the Mo film can prevent the migration of constituent atoms of the high-reflection metal film on the Mo film. However, the Mo film formed as a barrier electrode is a very thin film with a thickness of about 1 nm, and there arises the following problem. In the case where such a very thin metal film is formed on the reflection side, it is difficult to form the film evenly in the plane, so that local dispersions in reflectance are generated, leading to a situation where the reflection characteristic of the high-reflection metal film cannot be utilized sufficiently.

The problem of the dispersions of reflectance in the plane can be solved by enlarging the thickness of the metal film formed as the barrier electrode. However, in the case where the thickness of the metal film as the barrier electrode is enlarged, the light radiated from the active layer may fail to reach the high-reflection metal film, and the significance of the existence of the high-reflection metal film would rather be lost.

SUMMARY

In consideration of the above-mentioned technical problems, it is an object of the present invention to provide a semiconductor light-emitting device capable of realizing the effective prevention of migration while enhancing the light take-out efficiency by utilizing a high-reflection film and while suppressing local dispersions of reflectance. It is another object of the present invention to provide a semiconductor light-emitting apparatus configured by use of such a semiconductor light-emitting device, and a method of manufacturing the semiconductor light-emitting device.

A semiconductor light-emitting device according to the present invention is characterized in that an active layer is formed on a semiconductor layer of a first conduction type, a semiconductor layer of a second conduction type opposite to the first conduction type is formed on the active layer, and a thin film ohmic contact layer, a transparent conductive layer and a high-reflection metal layer for reflecting light generated by the active layer are sequentially layered on the semiconductor layer of the second conduction type.

With the high-reflection metal layer formed on the upper side of one of the semiconductor layers formed to sandwich the active layer, with the thin film ohmic contact layer and the transparent conductive layer therebetween, ohmic contact by the thin film ohmic contact layer is realized, and, at the same time, prevention of migration by the transparent conductive layer is also realized. The transparent conductive layer can transmit the light radiated from the active layer and can sufficiently transmit the light coming from the high-reflection metal layer formed thereon, whereby the problem of dispersions of reflectance in plane can be suppressed.

In an example of the semiconductor light-emitting device according to the present invention, the transparent conductive layer may be formed of an oxide-based transparent conductive material, a nitride-based transparent conductive material, a boride-based transparent conductive material, or a polymer-based transparent conductive material, and the high-reflection metal layer may be formed of a metal selected from the group composed of silver and aluminum. In addition, an example in which the semiconductor layer is composed of a nitride-based compound semiconductor is also an example of the present invention.

Furthermore, a semiconductor light-emitting apparatus according to the present invention is characterized in that a plurality of semiconductor light-emitting devices are arranged on a substrate, each of the semiconductor light-emitting device including an active layer formed on a semiconductor layer of a first conduction type, a semiconductor layer of a second conduction type formed on the active layer, the second conduction type being opposite to the first conduction type, and a thin film ohmic contact layer, a transparent conductive layer and a high-reflection metal layer for reflecting light generated by the active layer which are sequentially layered on the semiconductor layer of the second conduction type, and the high-reflection metal layer constitutes the whole part or a part of wirings between the adjacent semiconductor light-emitting devices.

The semiconductor light-emitting devices are connected to each other by the high-reflection metal layer constituting the whole part or a part of the wirings between the semiconductor light-emitting devices. In general, when the high-reflection metal layer is formed over the range covering island-like regions of a semiconductor layer so as to enlarge the reflecting surface thereof, the area of contact with the semiconductor layer is simultaneously enlarged, so that, by utilizing the high-reflection metal layer also as a wiring reduced in electric resistance, it is possible to contrive higher-speed operations of the light-emitting devices and a reduced driving current.

Besides, a method of manufacturing a semiconductor light-emitting device according to the present invention is characterized by including the steps of forming an active layer on a semiconductor layer of a first conduction type, forming on the active layer a semiconductor layer of a second conduction type opposite to the first conduction type, forming a thin film ohmic contact layer on the semiconductor layer of the second conduction type, forming a transparent conductive layer on the ohmic contact layer, and forming on the transparent conductive layer a high-reflection metal layer for reflecting light generated by the active layer.

According to the semiconductor light-emitting device of the present invention, ohmic contact owing to the thin film ohmic contact layer is realized and, simultaneously, prevention of migration by the transparent conductive layer is also realized. Furthermore, since the transparent conductive layer can transmit the light radiated from the active layer and can sufficiently transmit the light coming from the high-reflection metal layer formed thereon, the problem of dispersions of reflectance in plane can be suppressed.

According to the semiconductor light-emitting apparatus of the present invention, it is possible to contrive higher-speed operations of the semiconductor light-emitting devices and a reduced driving current while suppressing the dispersions of reflectance in plane. Therefore, where the semiconductor light-emitting devices are used as pixels in an image display apparatus, good images can be obtained, and the electric power consumed by the image display apparatus can be reduced.

Besides, according to a method of manufacturing a semiconductor light-emitting device according to the present invention, semiconductor light-emitting devices having the excellent advantages as above-mentioned can be formed with good accuracy.

Additional features and advantages of the present invention are described in, and will be apparent from, the following Detailed Description and the Figures.

DETAILED DESCRIPTION

Figure 1:
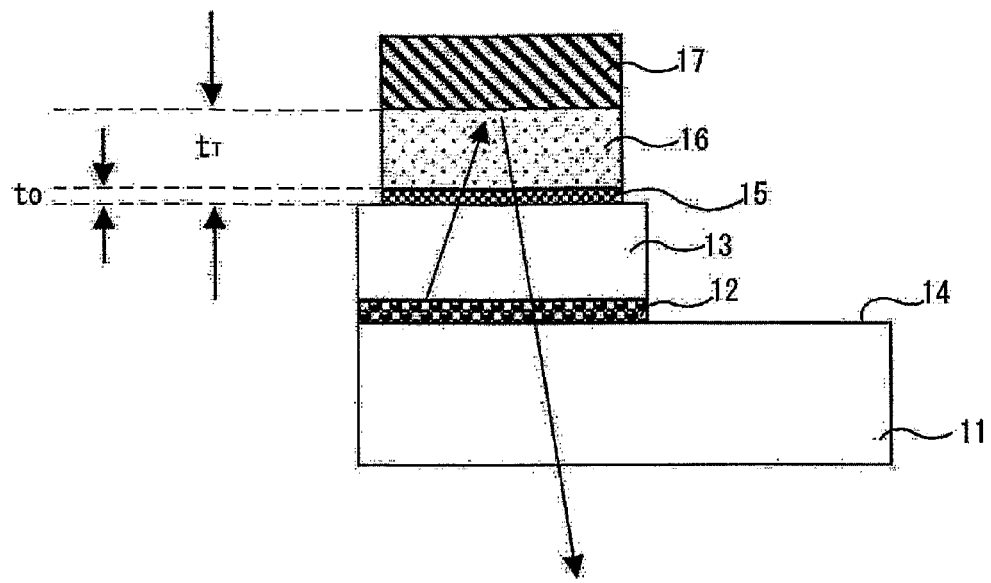
FIG. 1 is a device sectional view showing an example of a semiconductor light-emitting device according to the present invention.

A preferred embodiment of the present invention will be described referring to the drawings.

First Embodiment

This embodiment is an example of a light-emitting diode in which a GaN-based compound semiconductor layer is used as a semiconductor layer, and which has a device structure as shown in FIG. 1. As shown in the figure, an n-type GaN layer 11 as an n-type semiconductor layer is formed on a sapphire substrate or the like, then an active layer 12 composed, for example, of InGaN or the like is formed on the n-type GaN layer 11, and further a GaN layer 13 of the p-type which is the opposite conduction type to the n-type is formed on the active layer 12. While clad layers are provided on the upper and lower sides of the active layer 12 and a buffer layer or the like is formed under the n-type GaN layer 11, they are omitted in the drawing. The active layer 12 may be of a SQW (Single Quantum Well) or MQW (Multiple Quantum Well) structure.

The n-type GaN layer 11 is provided with a window portion 14 for securing an electrical connection region, and is connected to an n-side electrode (not shown) in the region of the window portion 14. On the other hand, a p-side electrode has a structure in which an ohmic contact layer 15 with a small film thickness t0 for making ohmic contact, a transparent conductive layer 16 formed of a transparent material and also functioning as a barrier layer for preventing migration of constituent atoms of a high-reflection metal layer 17 thereon, and the high-reflection metal layer 17 for reflecting light generated by the active layer 12 are laminated.

The ohmic contact layer 15 is a very thin film with the film thickness t0 of, for example, not more than 10 nm, preferably not more than a few nanometers; the ohmic contact thereof realizes a low-resistance connection, and the ohmic contact layer 15 itself is transparent to light. The ohmic contact layer 15 is a layer of a material such as Ni, Pt, Mg, Zn, Be, Ag, Au, Ge, etc. Where the ohmic contact layer 15 is composed of an Ni thin film with a thickness of about 2 nm, for example, the light radiated from the active layer 12 can be transmitted through the ohmic contact layer 15, the transmitted light can be reflected by the high-reflection metal layer 17 present above the ohmic contact layer 15.

On such an ohmic contact layer 15 is formed the transparent conductive layer 16 having the function of preventing migration of the constituent atoms of the high-reflection metal layer 17. The transparent conductive layer 16 has the migration preventive function and is excellent in light-transmitting characteristic, for enhancing the reflection efficiency at the high-reflection metal layer 17. The film thickness tT of the transparent conductive layer 16 is about 10 to 200 nm, preferably about 10 to 100 nm. If the film thickness tT is too small, the function of preventing migration of the constituent atoms of the high-reflection metal layer 17 may be lost; on the other hand, if the film thickness tT exceeds 200 nm, the transparency of the transparent conductive layer 16 may be lost and the transmittance of the layer 16 may be thereby degraded, though depending on the material forming the layer 16. The material of the transparent conductive layer 16 may be selected from oxide-based transparent conductive materials such as ITO, IZO, NiO, $In_2O_3$, ZnO, CdO, $TiO_2$, $CdIn_2O_4$, $Zn_2SnO_4$, $CaGaO_4$, etc., nitride-based transparent conductive materials such as TiN, ZrN, HfN, etc., and boride-based transparent conductive materials such as $LaB_6$; furthermore, conductive transparent polymer materials and the like may also be selected as the material of the layer 16. In the case where a transparent conductive layer of, for example, ITO or the like is formed, a sputtering method may be used, whereby a higher transmittance can be obtained, as compared with the case of forming the layer by a vapor deposition method or the like. Such a transparent conductive layer 16 can be formed in a larger film thickness, as compared with a barrier layer composed of a metal film according to the related art; in this case, the layer 16 can be liberated from the difficulty in control, which would occur in the case of a smaller film thickness, and the reproducibility of the semiconductor light-emitting device can be enhanced. In short, the semiconductor light-emitting device in this embodiment has such a structure that a high reflectance at the high-reflection metal layer thereon can be obtained while utilizing the sufficient light-transmitting function of the transparent conductive layer 16, the barrier function of the transparent conductive layer 16 can also be obtained simultaneously, and the light-transmitting and barrier functions can be obtained with good reproducibility.

On the transparent conductive layer 16 is formed the high-reflection metal layer 17 for reflecting at a high reflectance the light generated by the active layer 12, thereby enhancing the light take-out efficiency of the device as a whole. The high-reflection metal layer 17 is formed of a metal composed mainly of aluminum or silver. Where reflection is generated at a bottom portion of the high-reflection metal layer 17 as indicated by arrows in FIG. 1, the quantity of light taken out on the lower side of the device is increased, whereby the light take-out efficiency of the device is largely improved. The high-reflection metal layer 17 has a film thickness of, for example, several hundreds of nanometers, and is deposited by use of, for example, a vacuum evaporation method, a lift-off device or the like. In the case where the transparent conductive layer 16 is absent, migration of the constituent atoms of the high-reflection metal layer 17 due to diffusion would be generated, whereby the function of the device would be lost. In this embodiment, however, the transparent conductive layer 16 is present as a barrier layer, so that the problem of the migration would not be generated. While other metal layer, for example, a layer of Ti, Au or the like may be laminated on the high-reflection metal layer 17 to thereby complete the p-side electrode, an Al layer may, for example, be formed in a large thickness so as to constitute a wiring layer. Particularly in an image display apparatus or the like having a structure in which a plurality of semiconductor light-emitting devices are arranged on a substrate, the Al layer may be used also as a wiring layer, whereby it is made possible to reduce the number of manufacturing steps and to enhance the reproducibility in the manufacture of the device.

Thus, in the semiconductor light-emitting device according to this embodiment, a high reflectance at the high-reflection metal layer on the transparent conductive layer 16 can be obtained while utilizing the sufficient light-transmitting function of the transparent conductive layer 16. At the same time, a barrier function owing to the transparent conductive layer 16 can also be obtained, and the light-transmitting and barrier functions can be obtained with good reproducibility.

Figure 2:
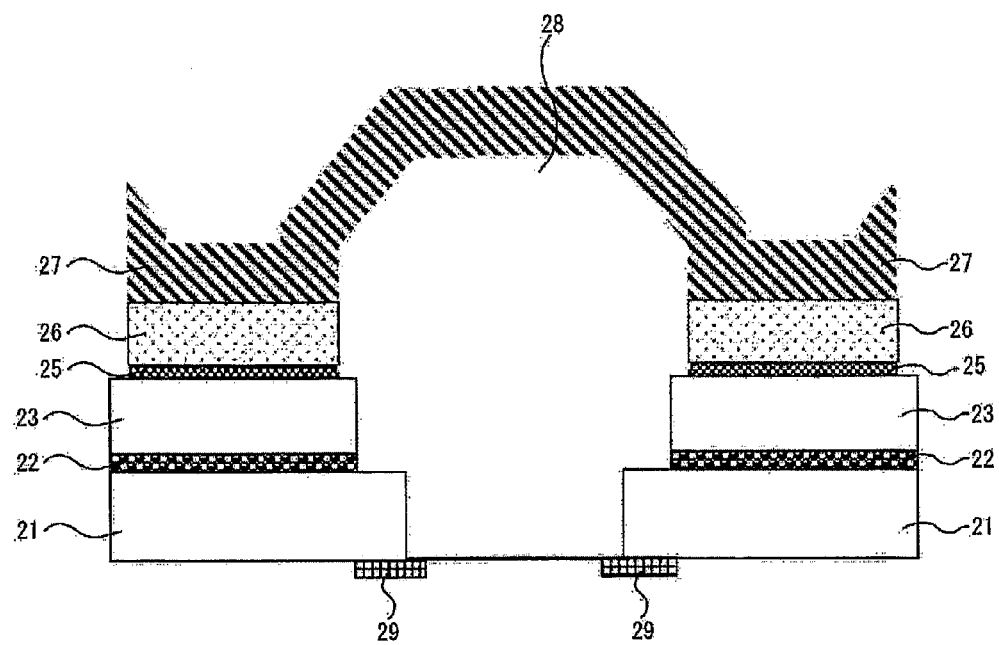
FIG. 2 is a sectional view showing an example of a semiconductor light-emitting apparatus according to the present invention.
Figure 3:
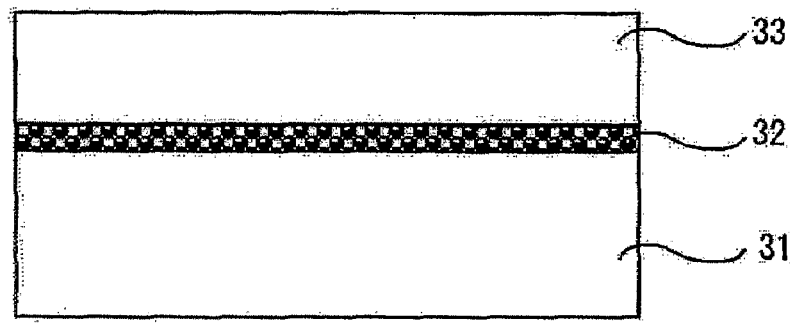
FIG. 3 is a sectional step diagram showing an example of a method of manufacturing a semiconductor light-emitting device according to the present invention, and is a diagram illustrating a process up to the formation of a p-type GaN layer.

Now, referring to FIG. 2, description will be made below of a semiconductor light-emitting apparatus in which a plurality of semiconductor light-emitting devices having a structure in which a transparent conductive layer is formed at a bottom portion of a high-reflection metal layer are arrayed. The semiconductor light-emitting apparatus in this embodiment is used, for example, as an image display apparatus or an illuminating apparatus, and a section thereof is shown in FIG. 2.

An n-type GaN layer 21 crystal grown by utilizing a sapphire substrate or the like is formed, an active layer 22 composed, for example, InGaN or the like is formed on the n-type GaN layer 21, and a GaN layer 23 of the p-type which is the opposite conduction type to the n-type is further formed on the active layer 22. An ohmic contact layer 25, a transparent conductive layer 26, and a high-reflection metal layer 27 are formed in a laminated manner on the p-type GaN layer 23.

Like the above-mentioned ohmic contact layer 15, the ohmic contact layer 25 is a very thin film with a film thickness of, for example, not more than 10 nm, preferably not more than a few nanometers, and is so configured that a low-resistance connection is realized owing to ohmic contact thereof, and the ohmic contact layer 25 itself is transparent to light. The ohmic contact layer 25 is a layer of a material such as Ni, Pt, Mg, Zn, Be, Ag, Au, Ge, etc., and the light radiated from the active layer 22 can be transmitted through the ohmic contact layer 25, so that the transmitted light can be reflected by the high-reflection metal layer 27 on the upper side of the active layer 22.

On the ohmic contact layer 25 is formed the transparent conductive layer 26 having a light-transmitting function and preventing migration of the constituent atoms of the high-reflection metal layer 27. Like the above-mentioned transparent conductive layer 16, the transmitting conductive layer 26 is formed of a material which may be selected from oxide-based transparent conductive materials such as ITO, IZO, NiO, $In_2O_3$, ZnO, CdO, $TiO_2$, $CdIn_2O_4$, $Zn_2SnO_4$, $CaGaO_4$, etc., nitride-based transparent conductive materials such as TiN, ZrN, HfN, etc., and boride-based transparent conductive materials such as $LaB_6$; furthermore, conductive transparent polymer materials and the like may also be selected as the material of the transmitting conductive layer 26.

In the next place, in the semiconductor light-emitting apparatus according to this embodiment, the high-reflection metal layer 27 formed on the transparent conductive layer 26 is a layer of a metal based on aluminum, for example, and functions also as a wiring layer between a plurality of the light-emitting devices. As shown in FIG. 2, the high-reflection metal layer 27 is so formed as to be continuous between the adjacent devices while ranging over an inter-device insulation region 28. The bottom surface, in the device region, of the high-reflection metal layer 27 functions as a high-reflection surface for reflecting the light radiated from the active layer 22, and the high-reflection metal layer 27 itself as a low-resistance layer is used also as a current path for electrical signals or the like. Since the wiring layer between the devices and the metal layer for high reflection are provided in a combined form, the layers need not be formed separately, whereby the number of manufacturing steps is reduced, and the positional matching between the reflective film and the wiring layer or the like is largely improved.

In FIG. 2, the n-side electrode 29 is arranged on the bottom side of the device. However, the position of the n-side electrode 29 is not particularly limited to a position on the bottom side, or a position between the layers or other position, inasmuch as the n-side electrode 29 is so located as not to obstruct the take-out of light and as to make contact with the n-type GaN layer 21.

Thus, in the semiconductor light-emitting apparatus according to this embodiment, the light radiated from the active layer 22 can be sufficiently reflected by the high-reflection metal layer 27 while preventing migration of the constituent atoms of the high-reflection metal layer 27 in each semiconductor light-emitting device, whereby the light take-out efficiency of the device can be enhanced. Further, in the semiconductor light-emitting apparatus according to the embodiment, the high-reflection metal layer 27 functions also as a wiring layer between the devices, so that there is no need for a new metal layer for laying of a wiring. Therefore, the number of manufacturing steps can be reduced, and the semiconductor light-emitting apparatus can be manufactured with good reproducibility, without generating such problems as misalignment between a reflection layer and a wiring layer.

Now, referring to FIGS. 3 to 8, an example of the method of manufacturing a semiconductor light-emitting device according to this embodiment will be described below. First, as shown, an n-type GaN layer 31 as an n-type semiconductor layer is formed on a sapphire substrate or the like, an active layer 32 composed of InGaN, for example, is formed on the n-type GaN layer 31, and a GaN layer 33 of the p-type which is the opposite conduction type to the n-type is further formed on the active layer 32. While clad layers are provided on the upper and lower sides of the active layer 32 and a buffer layer or the like is formed under the n-type GaN layer 31, they are omitted in the drawings. The active layer 32 may be of an SQW (Single Quantum Well) or MQW (Multiple Quantum Well) structure. As for the raw materials for growing the GaN layers, for example, trimethyl gallium (TMG) is used as a raw material of Ga which is a Group III element, trimethyl aluminum (TMA) is used as a raw material of Al which is a Group III element, trimethyl indium (TMI) is used as a raw material of In which is a Group III element, and ammonia ($NH_3$) is used as a material of N which is a Group V element. Besides, a mixed gas of hydrogen and nitrogen, for example, is used as a carrier gas. As for dopants, monosilane ($SiH_4$) is used as an n-type dopant, while methylcyclopentadienyl magnesium (($MCp)_2Mg$), for example, is used as a p-type dopant.

Figure 4:
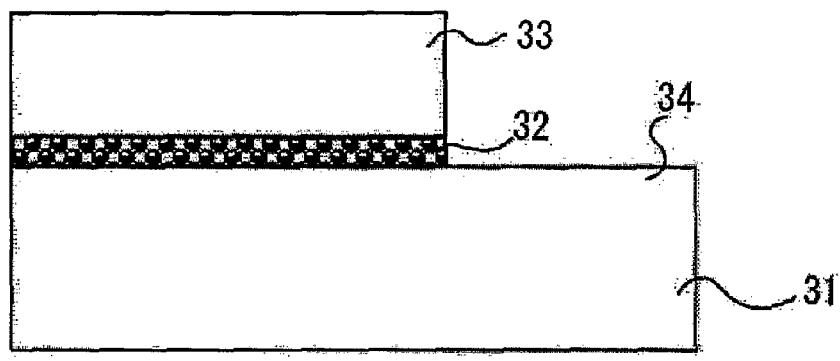
FIG. 4 is a sectional step diagram showing the example of the method of manufacturing a semiconductor light-emitting device according to the present invention, and is a diagram illustrating the process up to the formation of an opening in an n-type GaN layer.
Figure 5:
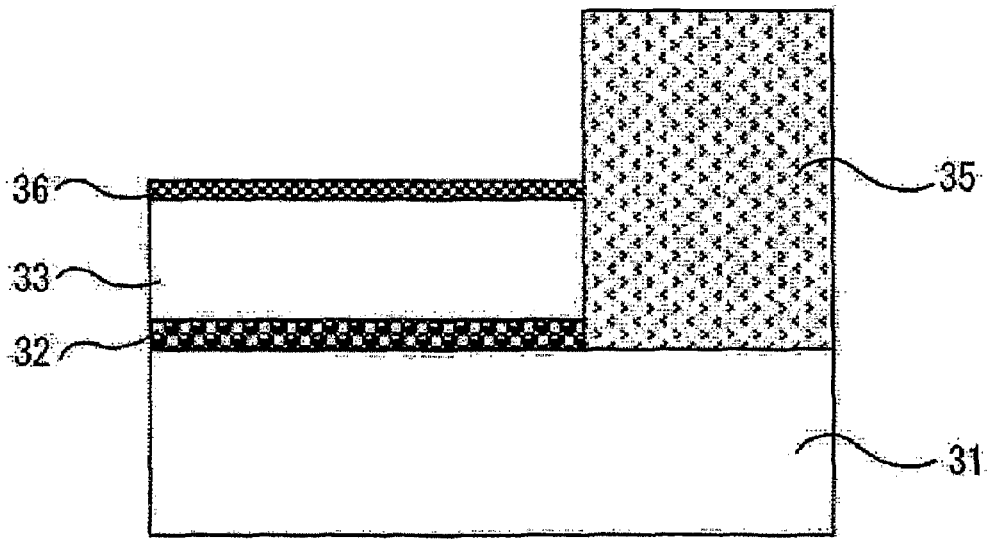
FIG. 5 is a sectional step diagram showing the example of the method of manufacturing a semiconductor light-emitting device according to the present invention, and is a diagram illustrating the process up to the formation of an insulating layer.

Subsequently, as shown in FIG. 4, the active layer 32 and the p-type GaN layer 33 on the upper side of the n-type GaN layer 31 are partly bored by a dry etching method, a wet etching method or the like, and the surface of the n-type GaN layer 31 is exposed in an opening portion 34 in the n-type GaN layer 31. An insulation layer 35 is formed in the region of the opening portion 34, and by a lift-off method or the like while utilizing the step of the insulation layer 35, an ohmic contact layer 36 is formed on the surface of the p-type GaN layer 33, as shown in FIG. 5. The ohmic contact layer 36 is formed, for example, by a vapor deposition method or the like, and is formed as a very thin film, of which the thickness is, for example, not more than 10 nm, preferably not more than a few nanometers, in the case where a metallic material such as Ni is used.

Figure 6:
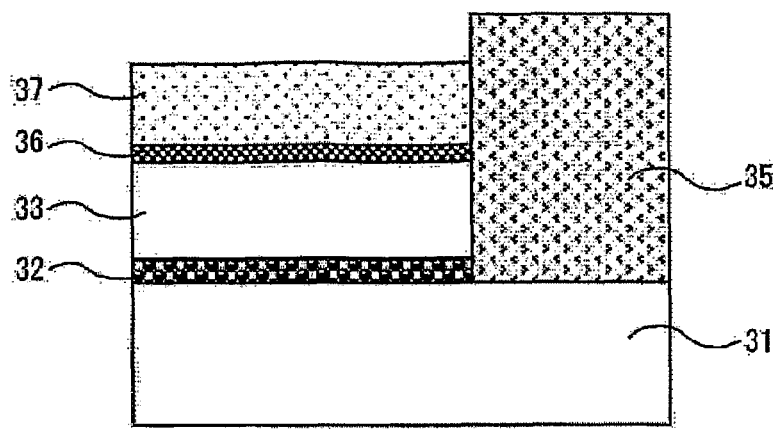
FIG. 6 is a sectional step diagram showing the example of the method of manufacturing a semiconductor light-emitting device according to the present invention, and is a diagram illustrating the process up to the formation of a transparent conductive layer.

After the formation of the ohmic contact layer 36 having such an extremely small film thickness, a transparent conductive layer 37 is formed on the ohmic contact layer 36, as shown in FIG. 6. The transparent conductive layer 37 is a film deposited, for example, by a sputtering method for securing transparency. As has been mentioned above, the material of the transparent conductive layer 36 may be selected from oxide-based transparent conductive materials such as ITO, IZO, NiO, $In_2O_3$, ZnO, CdO, $TiO_2$, $CdIn_2O_4$, $Zn_2SnO_4$, $CaGaO_4$, etc., nitride-based transparent conductive materials such as TiN, ZrN, HfN, etc., and boride-based transparent conductive materials such as $LaB_6$. In the case where a conductive transparent polymer material or the like is used for forming the transparent conductive layer 37, the layer can be formed in a desired pattern by a combination of a spin coating method and an etch-back method, or by a screen printing method or the like method. The film thickness of the transparent conductive layer 37 is about 10 to 200 nm, preferably about 10 to 100 nm, which is appropriately regulated according to the properties of the material and the like factors.

Figure 7:
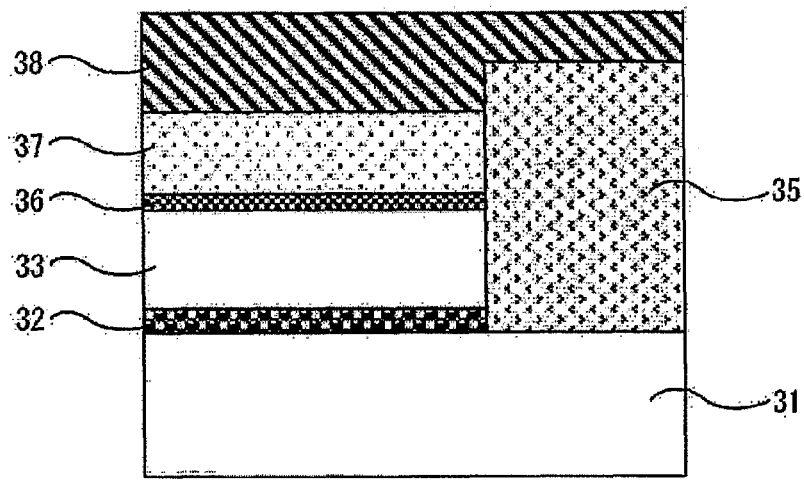
FIG. 7 is a sectional step diagram showing the example of the method of manufacturing a semiconductor light-emitting device according to the present invention, and is a diagram illustrating the process up to the formation of a high-reflection metal layer.
Figure 8:
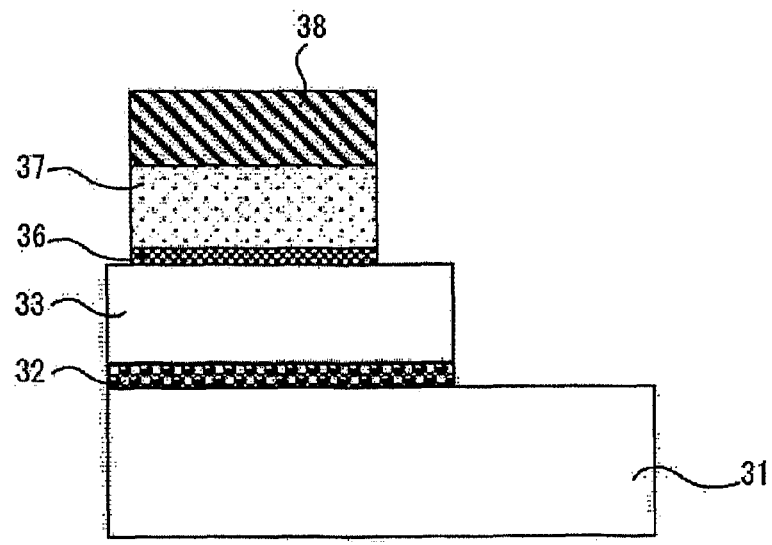
FIG. 8 is a sectional step diagram showing the example of the method of manufacturing a semiconductor light-emitting device according to the present invention, and is a diagram illustrating the process up to the step of patterning a p-side electrode.

Subsequently, as shown in FIG. 7, a high-reflection metal layer 38 is formed over the whole area including the area on the transparent conductive layer 37. The high-reflection metal layer 38 is a metal film based, for example, on silver or aluminum, and is formed by a vapor deposition method, a sputtering method or the like. After the formation of the high-reflection metal layer 38, the high-reflection metal layer 38 is processed into a desired pattern together with the transparent conductive layer 37 and the ohmic contact layer 36, as shown in FIG. 8, and an n-side electrode (not shown) is formed so as to be connected to the n-type GaN layer 31, whereby the device is completed.

Incidentally, the n-side electrode may be formed prior to the p-side electrode; for example, a sequence of steps may be adopted in which the n-side electrode is formed before the formation of the high-reflection metal layer 38 on the p-side and after the formation of the transparent conductive layer 37 and the ohmic contact layer 36.

According to the method of manufacturing a semiconductor light-emitting device in this embodiment, the ohmic contact layer 36 is formed on the lower side of the high-reflection metal layer 38, with the transparent conductive layer 37 therebetween. This ensures that the light radiated from the active layer 32 can be sufficiently reflected by the high-reflection metal layer 38 while preventing migration of the constituent atoms of the high-reflection metal layer 38, whereby the light take-out efficiency of the device can be enhanced. In addition, in the case where the transparent conductive layer 37 is formed by a sputtering method, a higher light transmission characteristic can be maintained and the light take-out efficiency of the device can be further improved, as compared with the case where the layer 37 is formed by a vacuum evaporation method.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A semiconductor light-emitting apparatus comprising a plurality of semiconductor light-emitting devices arranged on a substrate, wherein each said semiconductor light-emitting device includes an active layer formed on a semiconductor layer of a first conduction type, a semiconductor layer of a second conduction type formed on said active layer, said second conduction type being opposite to said first conduction type, and a thin film ohmic contact layer, a transparent conductive layer and a high-reflection metal layer for reflecting light generated by said active layer which are sequentially layered on said semiconductor layer of said second conduction type, and said high-reflection metal layer constitutes the whole part or a part of wirings between adjacent ones of said semiconductor light-emitting devices.

2. The semiconductor light-emitting device as set forth in claim 1, wherein said transparent conductive layer is formed of an oxide-based transparent conductive material, a nitride-based transparent conductive material, a boride-based transparent conductive material or a polymer-based transparent conductive material.

3. The semiconductor light-emitting device as set forth in claim 1, wherein said high-reflection metal layer is formed of a metal selected from the group composed of silver and aluminum.

4. The semiconductor light-emitting device as set forth in claim 1, wherein said semiconductor layer includes a nitride-based compound semiconductor.

5. The semiconductor light-emitting device of claim 1, wherein a thickness of the transparent conductive layer ranges from about 10 nm to about 200 nm.

* * * * *